United States Patent [19]
Vollaro

[11] Patent Number: 5,352,249
[45] Date of Patent: Oct. 4, 1994

[54] APPARATUS FOR PROVIDING CONSISTENT, NON-JAMMING REGISTRATION OF SEMICONDUCTOR WAFERS

[75] Inventor: Joseph F. Vollaro, Pleasantville, N.Y.

[73] Assignee: Hughes Aircraft Company, Los Angeles, Calif.

[21] Appl. No.: 937,793

[22] Filed: Aug. 28, 1992

[51] Int. Cl.[5] ............................................. B23Q 3/18
[52] U.S. Cl. .................................. 29/25.01; 269/305; 269/903
[58] Field of Search ................ 269/903, 305; 29/25.01

[56] References Cited

U.S. PATENT DOCUMENTS

| | | | |
|---|---|---|---|
| 4,189,230 | 2/1980 | Zasio | 269/903 |
| 4,350,866 | 9/1982 | Zasio et al. | 269/903 |
| 4,376,482 | 3/1983 | Wheeler et al. | 198/394 |
| 4,621,797 | 11/1986 | Ziegenfuss | 269/305 |
| 4,943,148 | 7/1990 | Mondragon et al. | 269/97 |
| 5,180,150 | 1/1993 | Prusak et al. | 269/305 |

FOREIGN PATENT DOCUMENTS

WO8809303 12/1988 PCT Int'l Appl.

OTHER PUBLICATIONS

Patent Abstracts of Japan, vol. 7, No. 272 (E-214) (417).

*Primary Examiner*—R. Bruce Breneman
*Assistant Examiner*—Ourmazd S. Ojan
*Attorney, Agent, or Firm*—M. E. Lachman; M. W. Sales; W. K. Denson-Low

[57] ABSTRACT

An apparatus (40) for providing consistent, non-jamming registration of a semiconductor wafer (46) undergoing process work includes a plate (42) upon which the wafer (46) is laid flat. A flat (45) of the wafer (46) is registered against two rollers (43') that are fixedly mounted to the plate (42). A third roller (43), also fixedly mounted to the plate (42), registers a first point (47) along the circumference of the wafer (46). A fourth roller (48) is fixedly mounted to a bracket (50) that is movable approximately along the radius of the wafer (46). A force (54) is applied to this bracket (50) resulting in the fourth roller (48) applying a force against the wafer (46). This resultant force, coupled with the rotating capability of the rollers (43, 43', 48), allows the wafer (46) to rotate into a proper registration position. A second embodiment (60) that incorporates essentially these same force and rotation dynamics through the use of flexures (64, 66, 68) is also disclosed.

17 Claims, 5 Drawing Sheets

APPARATUS FOR PROVIDING CONSISTENT, NON-JAMMING REGISTRATION OF SEMICONDUCTOR WAFERS

BACKGROUND OF THE INVENTION

1. Field of the Invention

The present invention relates to the registration of semiconductor wafers undergoing metrology and/or thinning and etching processes and, more particularly, to an apparatus that provides consistent, non-jamming registration of semiconductor wafers in order to correlate thinning and etching processes with metrology process data.

2. Description of the Prior Art

The process of measuring the thickness of an outer material layer of a semiconductor wafer is known as wafer surface metrology. During such a metrology process, a semiconductor wafer is mechanically registered to a stage of a thickness measuring instrument. This instrument generates a map that indicates the thickness of the outer material layer over an entire surface of the wafer. The outer layer thickness map generated from this metrology process is often used in other processes that thin or etch the material of the outer layer of the wafer to a desired thickness or in a desired location, respectively. These outer layer thinning and etching processes both include some type of tool that is directed onto the surface of the wafer. This tool must be properly positioned along the wafer surface to ensure that the thinning or etching process is performed at the correct location on the wafer surface. To ensure this proper wafer registration an accurate correlation between the outer layer thickness map and the position of the wafer with respect to the thinning or etching tool is required.

A current approach for correlating an outer layer thickness map with the position of a wafer in a thinning or etching instrument begins by marking the wafer with a set of alignment fiducials during the metrology process. The wafer is then placed on a larger diameter wafer which serves as a surround. The surround is made of the same material as the wafer undergoing work so as to maintain a consistent reaction in the thinning or etching process along the wafer edge. The flat of the fiducialized wafer is abutted to a flat registration surface of similar material that is taped to the surface of the surround, thereby registering the wafer in one direction. The wafer metrology fiducials are then visually aligned with a corresponding set of scribe marks on an aluminum holding plate, or platen, of the instrument. Once aligned, two additional registration surfaces of like wafer material are abutted against the wafer and taped to the surround to maintain the wafer position. The surround is then taped to the platen so that the thinning or etching process may begin.

It is easily seen that the above described correlated registration procedure is time consuming and prone to human error. It is therefore desirable to accelerate this registration procedure while eliminating the potential for human error. Such an accelerated registration procedure is achievable with an apparatus, described more thoroughly in the preferred embodiment section of this document, that is presently used to provide consistent registration of semiconductor wafers in metrology and thinning and etching instruments. However, a disadvantage of this apparatus is that jamming can occur between the wafer to be registered and the registration surfaces of the apparatus. Thus, it is desirable to prevent such jamming while also decreasing the time required for performing such a semiconductor wafer registration procedure.

SUMMARY OF THE INVENTION

The present invention contemplates an apparatus that provides consistent registration of semiconductor wafers and provides correlation between thinning and etching processes and metrology process data. Such an apparatus can be realized in three embodiments, each of which provides a unique non-jamming feature. In its broadest aspect, the invention in its various embodiments includes movable elements which "movably accommodate" points on the wafer during registration, meaning these elements themselves move (flex, rotate) as the wafer is being registered to minimize friction and therefore jamming during registration.

The first two embodiments both consist of a metal plate upon which a wafer undergoing work lays flat. The wafer is registered to the metal plate by three rollers that are fixedly mounted to the plate. Two of these three fixedly mounted rollers are positioned on the metal plate such that the flat of the wafer, when properly registered, is abutted against both of these rollers. The third fixedly mounted roller is positioned on the metal plate such that the wafer, when properly registered, is abutted against this roller at a point on the wafer approximately $-120°$ from the wafer flat. Proper registration is insured by a fourth, adjustable roller that is fixedly mounted on a moveable metal bracket which allows the roller to move in an approximately radial direction. This fourth, adjustable roller applies a force against the wafer, by way of a force applied to the moveable metal bracket at a point on the wafer approximately $120°$ from the wafer flat. This force, coupled with the rolling capability of the rollers, insures that an improperly registered wafer will be rotated into the proper registration position. Also, due to the fact that the rollers, by virtue of having rolling element bearings, generally exhibit only a slight amount of friction, or a rolling friction, the effective coefficient of friction between the rollers and the wafer is significantly less than a critical value in the effective coefficient of friction above which wafer jamming occurs. Thus, the wafer will be properly registered without jamming.

The only difference between the first and the second embodiments is the way in which the metal bracket is movable. In the first embodiment, the metal bracket slides along an approximately radial groove formed in the metal plate. In the second embodiment, the metal bracket pivots in a manner that allows the roller to move in the approximately radial direction.

The third embodiment encompasses essentially the same principle of the first two embodiments except that metal flexures are substituted for rollers. These metal flexures are created by fabricating or milling a metal plate to include such flexures. Associated with each metal flexure are one or more registration surfaces. These registration surfaces, either separately fixedly mounted to each flexure or fabricated or milled along with the flexures, serve to properly register the wafer. Similar to the rollers of the first two embodiments, two registration surfaces, both associated with one flexure, are used to register the wafer flat. Also, one registration surface registers a point on the wafer approximately $-120°$ from the wafer flat and one registration surface applies a force against the wafer at a point on the wafer approximately 120° from the wafer flat. The applied force, coupled with the flexing capability of the flexures, insures that an improperly registered wafer will be rotated, along with the point contacted registration surfaces, into the proper registration position. Also, since forces tending to impede such rotation are determined by movement of the flexures and not by friction against the registration surfaces, as is the case in the prior art, wafer jamming will not occur. Thus, as long as the motion of the flexures is limited to acceptable values, the wafer will be properly registered without jamming.

It should be noted that unlike the prior art, where the registration surfaces and the surround are fabricated to minimize the same material as the wafer undergoing work, the present invention rollers, registration surfaces, and associated mounting plates, are not subject to this same material constraint. As previously described, this constraint is required in the prior art so that consistent thinning and etching processes are maintained along the wafer edge. Although this material constraint does fulfill the objective of maintaining consistent processes, an undesirable result of increased material replacement occurs since the thinning and etching processes depreciatively affect the registration and surround materials.

The material constraint and resulting material replacement problems of the prior art are overcome in the present invention by selecting the rollers, registration surfaces, and associated mounting plates from the depreciative effects of the thinning and etching processes. Thus, the materials used in all of the embodiments of the present invention can be selected with practical considerations such as cost and reliability in mind, instead of impractical and costly material constraints.

The embodiments described above can be used in thinning, etching, and metrology processes, among others, and both provide consistent non-jamming registration of semiconductor wafers undergoing process work regardless of diameter variations among processed wafers. Furthermore, these embodiments decrease the registration time associated with the tedious visual alignment procedures of the prior art, while eliminating the potential for human error.

Accordingly, the primary objective of the present invention is to provide an apparatus that provides consistent, non-jamming registration of semiconductor wafers.

Another objective of the present invention is to provide an apparatus that can accurately correlate metrology process data to wafer registration in thinning and etching process instruments.

Another objective of the present invention is to provide an apparatus that eliminates human error during wafer registration procedures.

Another objective of the present invention is to provide an apparatus that decreases wafer registration time as compared to prior art registration procedures.

PREFERRED EMBODIMENTS OF THE PRESENT INVENTION

Figure 1:
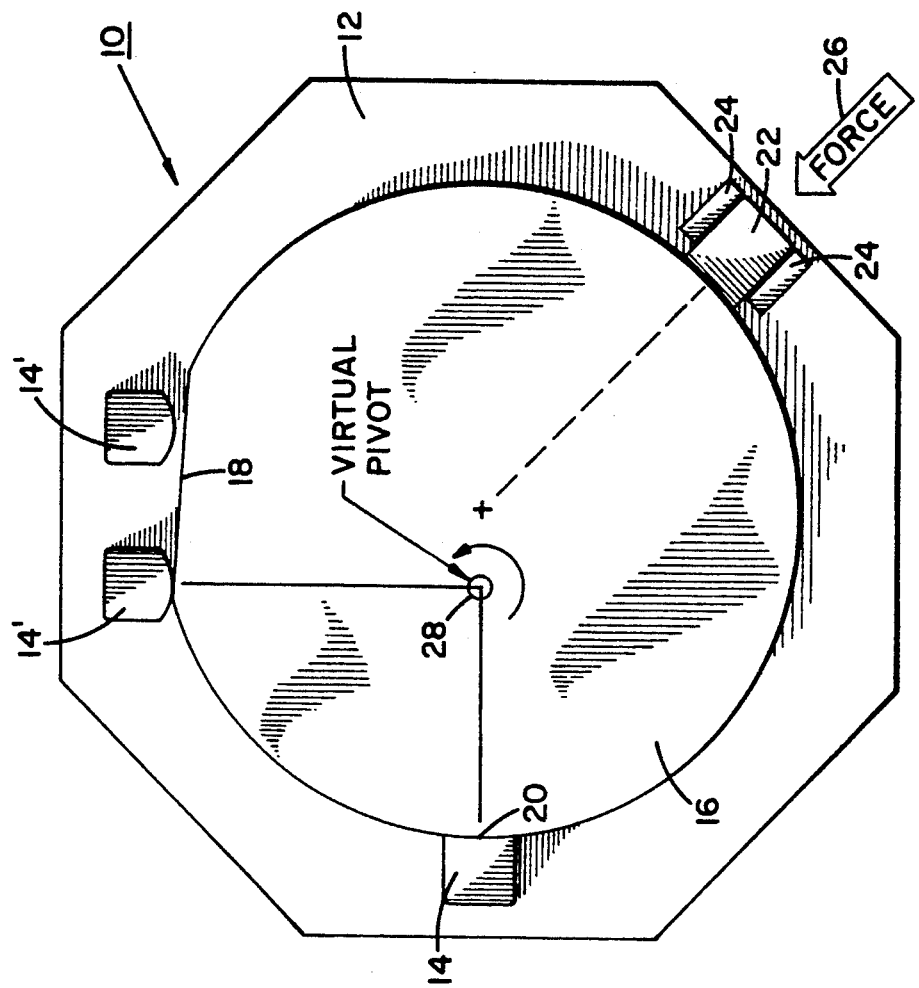
FIG. 1 is a plan view of a prior art semiconductor wafer registration apparatus that is experiencing a first type of wafer jamming.

Referring to FIG. 1, there is shown a prior art wafer registration apparatus 10, the use of which can result in wafer-jamming. This prior art apparatus 10 maintains a surround 12 upon which three registration surfaces 14, 14' and two guides 24 are fixedly mounted. Two 14' of the three 14, 14' fixedly mounted registration surfaces are for registering a flat 18 of a wafer 16. The third fixedly mounted registration surface 14 is positioned so as to register a point 20 on the wafer 16 approximately −90° from the wafer flat 18.

A fourth, adjustable registration surface 22 is placed between the two fixedly mounted guides 24. In order to securely constrain the wafer 16 a force 26 is applied to this fourth, adjustable registration surface 22, and hence to the wafer 16. This force 26 tends to rotate the wafer 16 about a virtual pivot 28 until contact is made with all of the registration surfaces 14, 14', 22. However, friction at the points of contact between the wafer 16 and the registration surfaces 14, 14', 22 tends to impede this necessary rotation. In fact, a critical value in the effective coefficient of friction between the wafer 16 and the registration surfaces 14, 14', 22 exists above which the necessary rotation does not occur regardless of the magnitude of the applied force 26. This results in a friction jam that causes the wafer 16 to be improperly registered as shown.

Figure 2:
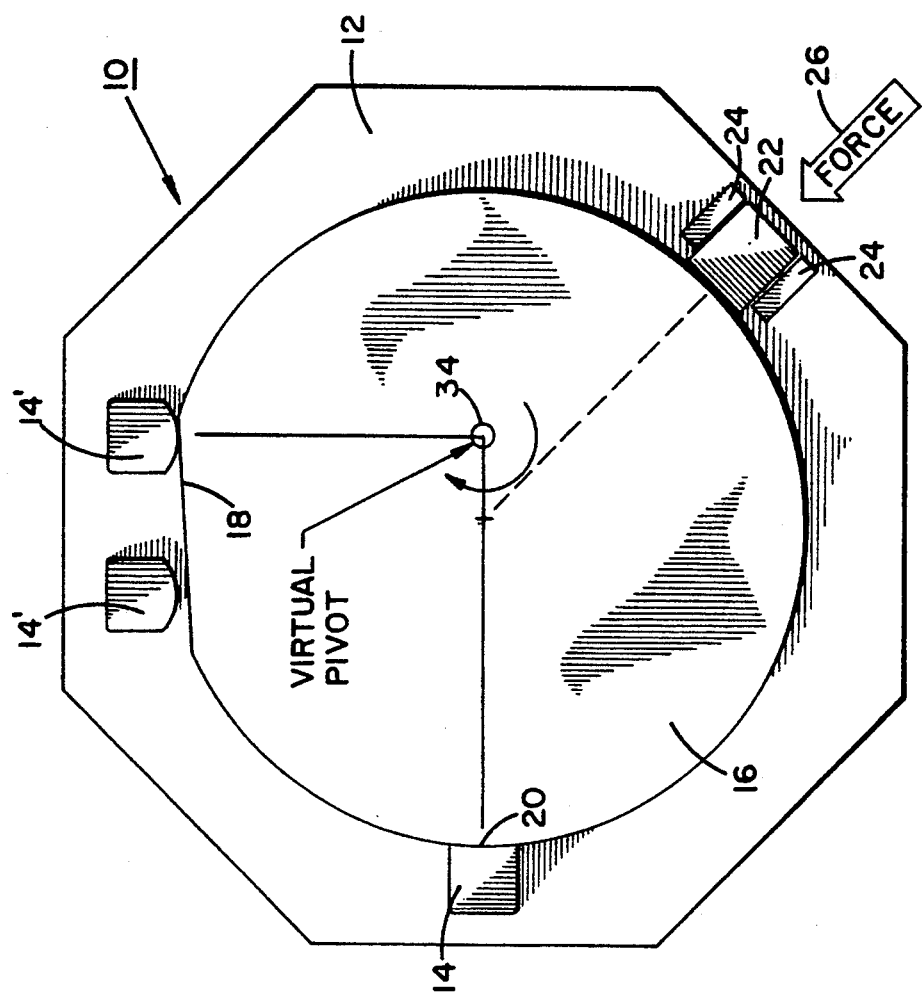
FIG. 2 is a plan view of a prior art semiconductor wafer registration apparatus that is experiencing a second type of wafer jamming.

Referring to FIG. 2, there is shown a prior art apparatus 10 identical to that shown in FIG. 1, the only difference being that the force 26 tends to rotate the wafer 16 about a different virtual pivot 34. This different virtual pivot is a result of the flat 18 of the wafer 16 being in contact with a different wafer flat registration surface 14' than as shown in FIG. 1. However, as in the case of FIG. 1, friction at the points of contact between the wafer 16 and the registration surfaces 14, 14' 22 tends to impede the rotation that is necessary for the wafer 16 to make contact with all of the registration surfaces 14, 14', 22 and thereby insure its proper registration. Thus, regardless of where the wafer 16 pivots in this prior art apparatus 10, friction between the wafer 16 and the registration surfaces 14, 14', 22 can cause wafer jamming resulting in improper wafer registration.

Figure 3:
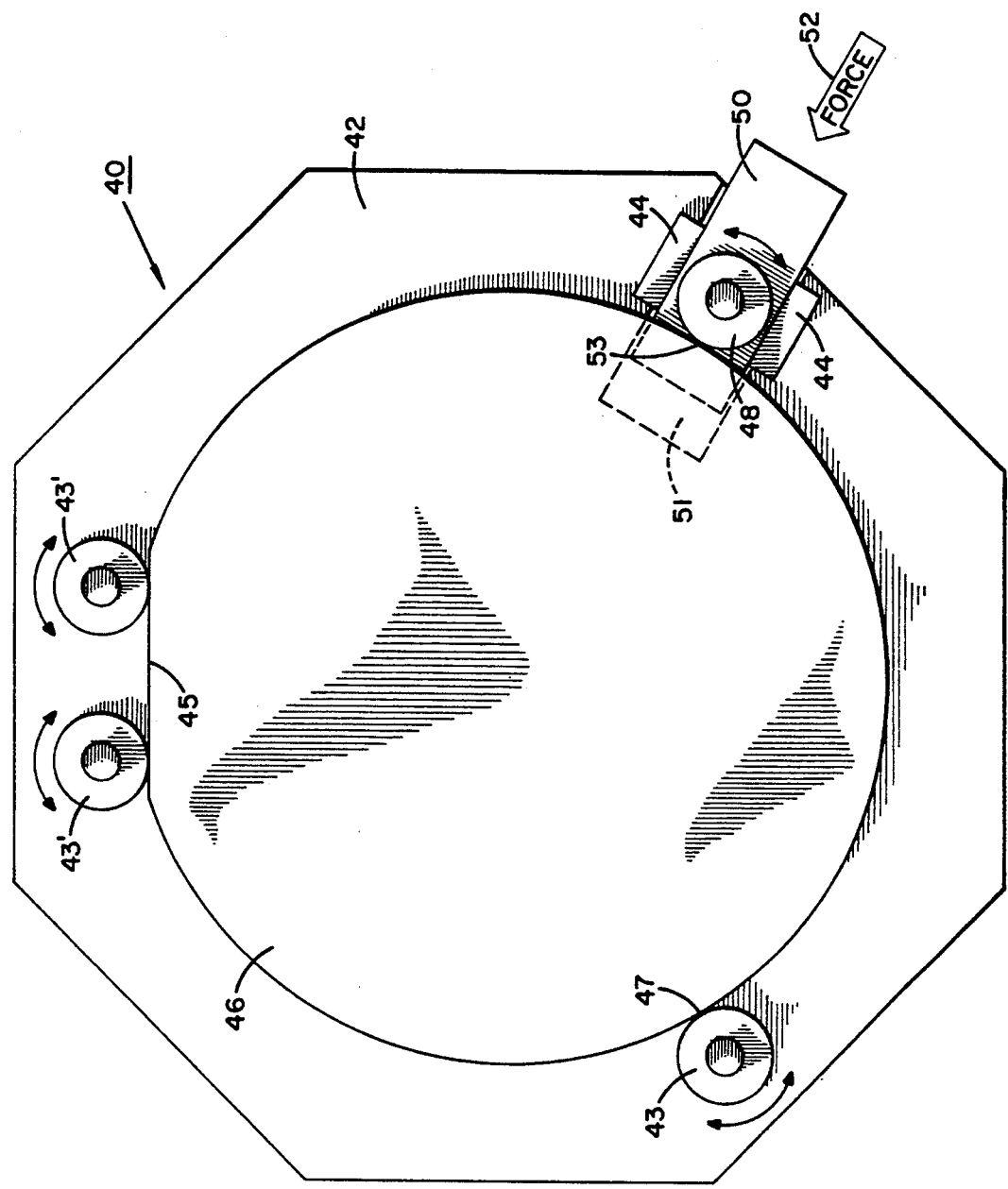
FIG. 3 is a first embodiment of the present invention wherein rollers are used to consistently register semiconductor wafers.

Referring to FIG. 3, there is shown a first embodiment 40 of the present invention which overcomes the previously mentioned friction-jamming problems of the prior art. This embodiment 40 includes an aluminum plate 42 upon which three rollers 43, 43', and two guides 44 are fixedly mounted. The aluminum plate 42 also provides an area upon which a semiconductor wafer 46 can be laid flat. Two 43' of the three 43, 43' fixedly mounted rollers are positioned on the plate 42 such that the flat 45 of the wafer 46, when properly registered, is abutted against both of these rollers 43'. The third 43 fixedly mounted roller is positioned on the plate 42 such that the wafer 46, when properly registered, is abutted against this roller 43 at a point 47 on the wafer 46 approximately −120° from the wafer flat 45.

A fourth, adjustable roller 48 is fixedly mounted to a sliding aluminum bracket 50 that is positioned between the two guides 44 and within a radial groove 51 that has been fabricated or milled into the aluminum plate 42. As should be apparent from the Figure to one with ordinary skill in the art, the purpose of the two guides 44 is to restrict the sliding aluminum bracket 50, and hence the fourth roller 48, to an approximately radial movement with respect to the wafer 46.

To insure proper wafer registration, an external force 52 is applied to the sliding aluminum bracket 50. This externally applied force 52 results in the fourth roller 48 applying a similar force against the wafer 46 at a point 53 on the wafer approximately 120° from the wafer flat 45. This resulting force, coupled with the rolling capability of the rollers 43, 43', 48, insures that an improperly registered wafer will be rotated into the proper registration position. Also, due to the fact that the rollers, by virtue of having rolling element bearings, generally exhibit only a slight amount of friction, or a rolling friction, the effective coefficient of friction between the rollers 43, 43', 48 and the wafer 46 is significantly less than the critical value in the effective coefficient of friction above which wafer jamming occurs. Thus, the wafer 46 will be properly registered without jamming. Of course, proper registration will only occur when the wafer 46 is originally positioned on the plate 42 in a manner that will allow such registration, i.e. the wafer flat 45 must be in contact with, or be in sufficiently close proximity to, at least one of the two wafer flat rollers 42'. The present state of the art in wafer handling systems is such that this original positioning condition should be easily achieved.

Figure 4:
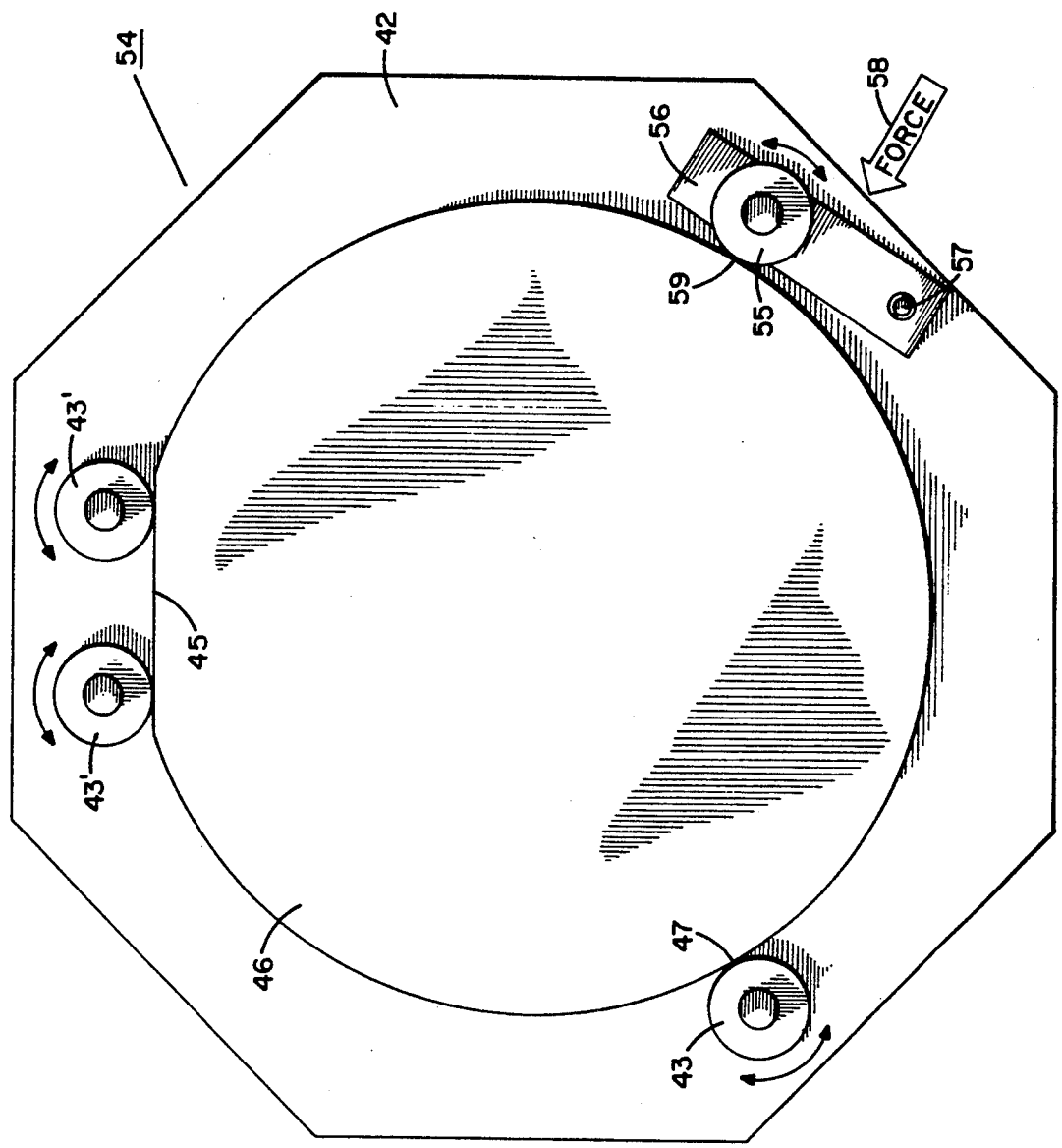
FIG. 4 is a second embodiment of the present invention wherein rollers are used to consistently register semiconductor wafers.

Referring to FIG. 4, there is shown a second embodiment 54 of the present invention which overcomes the previously mentioned friction-jamming problems of the prior art. This second embodiment 54 is essentially identical to the first embodiment 40, except that a fourth, adjustable roller 55 is fixedly mounted to a pivoting aluminum bracket 56 instead of a sliding aluminum bracket 50. The pivoting aluminum bracket 56 pivots about an aluminum pivot pin 57 that is fixedly mounted to the aluminum plate 42. The position of the pivot pin 57, and hence the pivot movement of the bracket 56, is such that the fourth roller 55 is restricted to an approximately radial movement with respect to the wafer 46. Similar to the first embodiment 40, an external force 58 is applied to the pivoting aluminum bracket 56 that results in the fourth roller 55 applying a similar force against the wafer 46 at a point 59 approximately 120° from the wafer flat 45. This resulting force, coupled with the rolling capability of the rollers 43, 43', 55, insures that an improperly registered wafer will be rotated into the proper registration position, as shown, without jamming.

Figure 5:
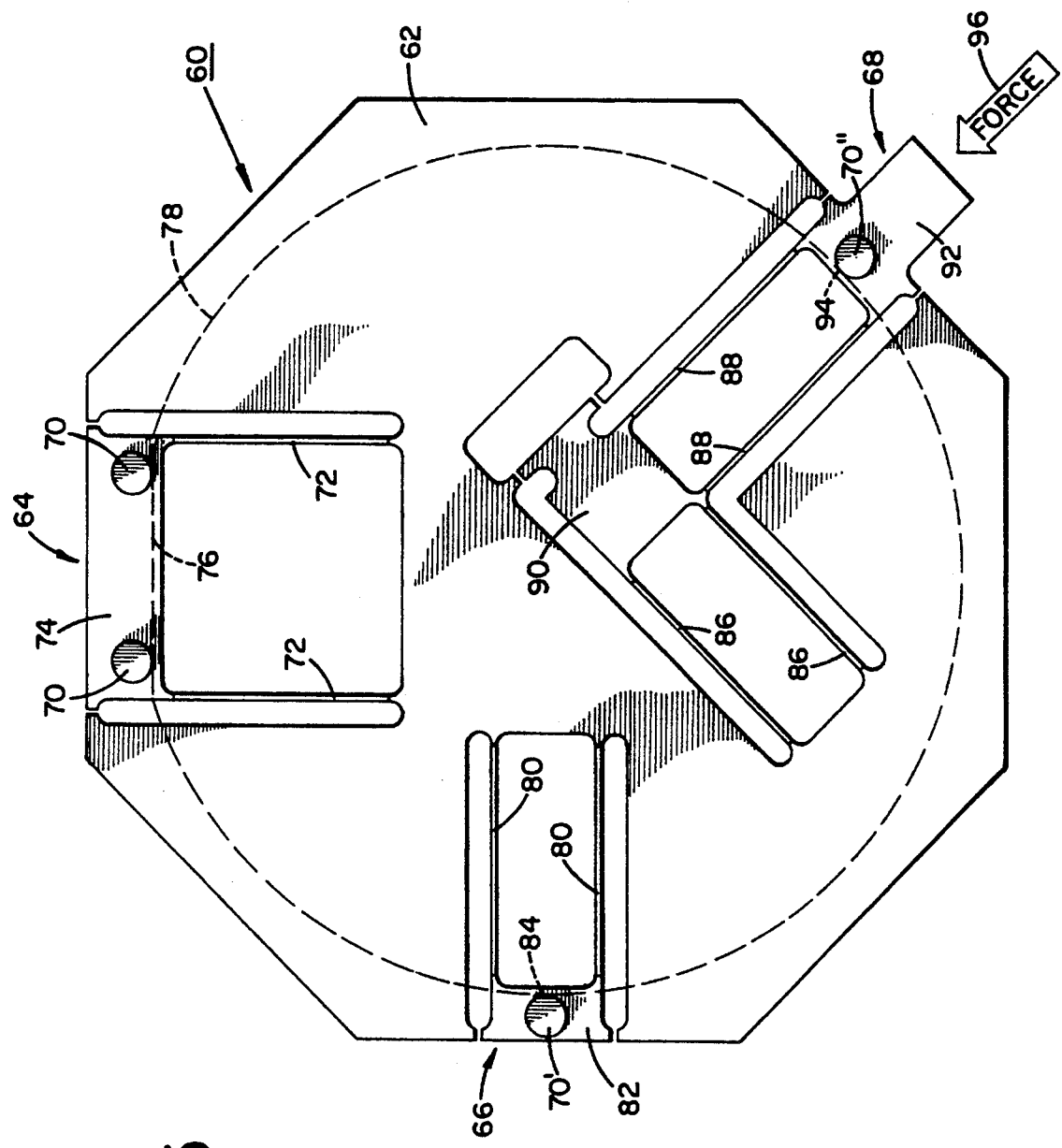
FIG. 5 is a third embodiment of the present invention wherein flexures are used to consistently register semiconductor wafers.

Referring to FIG. 5, there is shown a third embodiment 60 of the present invention which overcomes the previously mentioned friction-jamming problems of the prior art. This embodiment 60 includes an aluminum plate 62 that has been fabricated or milled to include several flexures 64, 66, 68. The term "flexure" as used herein means a flexure pivot, flexure pivot bearing, or like elastic deformable members. Associated with each flexure 64, 66, 68 are one or more registration surfaces 70, 70', 70" that are either separately fixedly mounted to each flexure 64, 66, 68 or fabricated or milled along with the flexures 64, 66, 68, respectively.

A first flexure 64 is fabricated or milled having two flexure blades 72 and a flexure head 74. This first flexure 64 has two associated registration surfaces 70 that serve to properly register the flat 76 of a wafer 78 (shown in dotted line form so that the flexure 64, 66, 68 structures can be more clearly illustrated). The two flexure blades 72 of this first flexure 64 allow the flexure head 74, and hence the two associated registration surfaces 70, to move in a manner that results in wafer 78 rotation which thereby insures proper wafer 78 registration.

A second flexure 66 is fabricated or milled having two flexure blades 80 and a flexure head 82. This second flexure 66 has one associated registration surface 70' that serves to properly register a point 84 on the wafer 78 approximately −90° from the flat 76 of the wafer 78. The two flexure blades 80 of this second flexure 66 allow the flexure head 82, and hence the one associated registration surface 70', to move in a manner that also results in wafer 78 rotation which thereby insures proper wafer 78 registration. It should be noted, however, that, like the first two embodiments 40, 54 of FIGS. 3 and 4, respectively, it would be preferable to register the wafer 78 at a point approximately −120° from the flat 76 of the wafer 78 instead of at the point 84 approximately −90° from the flat 76 of the wafer 78, as shown. This preference is based on an increase in the rotational torque on the wafer 78 that results when an external force is applied against the wafer 78, as will be shortly described in more detail. However, due to a potential structural weakness in the aluminum plate 62 which can result from having the flexures 64, 66, 68 located too close together, the second flexure 66, and hence its associated registration surface 70', is located such that the wafer 78 is properly registered at the point 84 approximately −90° from the wafer flat 76, as shown.

A third flexure 68 is fabricated or milled having four, or two pairs of, flexure blades 86, 88 and two flexure heads 90, 92, wherein one of these flexure heads 90, 92 corresponds to one of the two pairs of flexure blades 86, 88, respectively. This third flexure 68 has one associated registration surface 70" that serves both to properly register a point 94 on the wafer 78 approximately 120° from the flat 76 of the wafer 78, and to apply a force against the wafer 78 at this point 94. A first set of flexure blades 88 performs a function similar to the first 64 and second 68 flexures, whereby the corresponding flexure head 92, and hence the one associated registration surface 70", is allowed to move in a manner that results in wafer 78 rotation which thereby ensures proper wafer 78 registration. A second set of flexure blades 86 performs a function different from the first 64 and second 66 flexures, whereby an external force 96 is allowed to be applied to the flexure 68, and hence to the wafer 78, through the one associated registration surface 70". This externally applied force 96, coupled with the flexing capability of the flexures 64, 66, 68, ensures that an improperly registered wafer will be rotated, along with the point contacted registration surfaces 70, 70', 70" and their associated flexure heads 74, 82, 92, respectively, into the proper registration position. Also, since forces tending to impede such rotation are determined by movement of the flexures 64, 66, 68 and not by friction against the registration surfaces 70, 70', 70", as is the case in the prior art, wafer jamming will not occur. Thus, as long as the motion of the flexures 64, 66, 68 is limited to acceptable values, the wafer 78 will be properly registered without jamming. Of course, as is the case in the first two embodiments 40, 54 of FIGS. 3 and 4, respectively, proper registration will only occur when the wafer 78 is originally positioned on the plate 62 in a manner that will allow such registration. Again, however, the present state of the art in wafer handling systems is such that this original positioning condition should be easily achieved.

It should be noted that although all embodiments 40, 54, 60 have been described herein with aluminum being the material of the plates 42, 62 and the other associated components, other practical materials may also be used. However, in the case of the third embodiment 60 the plate 62 must be made of a material that allows sufficient elasticity in the flexures 64, 66, 68.

It is thus seen that the objectives set forth above are efficiently attained and, since certain changes may be made in the above described embodiments without departing from the scope of the invention, it is intended that all matter contained in the above description or shown in the accompanying drawings shall be interrupted as illustrative and not in a limiting sense.

I claim:

1. An apparatus for providing consistent, non-jamming registration of semiconductor wafers undergoing process work in a plurality of process instruments, wherein each semiconductor wafer has a flat formed along a portion of its circumference, said apparatus comprising:
    means for providing a support upon which a semiconductor wafer is registered;
    movable means for providing a registration that movably accommodates a flat of said semiconductor wafer;
    movable means for providing a registration that movably accommodates a first point along the circumference of said semiconductor wafer; and
    movable means for providing a registration that movably accommodates a second point along the circumference of said semiconductor wafer, such that said movable flat registration means, said movable first point registration means, and said movable second point registration means movably accommodate said semiconductor wafer via a force that is applied to said semiconductor wafer by said movable second point registration means such that friction between said movable means and said wafer is minimized to reduce jamming during registration.

2. The apparatus as defined in claim 1, wherein said means for providing support comprises a plate having a surface upon which said semiconductor wafer is laid flat.

3. The apparatus as defined in claim 2, wherein said plate includes an approximately radial groove that assists in directing said applied force approximately along the radius of said semiconductor wafer.

4. The apparatus as defined in claim 3, wherein said plate is made of aluminum so as to withstand depreciative effects associated with said plurality of process instruments.

5. The apparatus as defined in claim 1, wherein said movable means for providing a registration to a flat or said semiconductor wafer comprises two rollers, wherein both of said rollers are fixedly mounted to said support means, and wherein both of said rollers movably accommodate said flat of said semiconductor wafer by having said wafer abut against said rollers and by allowing said wafer to rotate into a proper registration position as said rollers rotate.

6. The apparatus as defined in claim 1, wherein said movable means for providing a registration to a flat of said semiconductor wafer comprises two registration surfaces and a first flexure, wherein both of said registration surfaces are coupled to said first flexure, wherein said first flexure is formed as a part of said support means, and wherein said registration surfaces and said first flexure movably accommodate said flat of said semiconductor wafer by having said wafer abut against said registration surfaces and by allowing said wafer to rotate into a proper registration position.

7. The apparatus as defined in claim 1, wherein said means for providing a registration to a first point along the circumference of said semiconductor wafer comprises a roller, wherein said roller is fixedly mounted to said support means, and wherein said roller movably accommodates said first point along the circumference of said semiconductor wafer by having said wafer abut against said roller and by allowing said wafer to rotate into a proper registration position.

8. The apparatus as defined in claim 7, wherein said first point along the circumference of said semiconductor wafer is approximately −120° from said wafer flat.

9. The apparatus as defined in claim 1, wherein said movable means for providing a registration to a first point along the circumference of said semiconductor wafer comprises a registration surface and a second flexure, wherein said registration surface is coupled to said second flexure, wherein said second flexure is formed as a part of said support means, and wherein said registration surface and said second flexure movably accommodate said first point along the circumference of said semiconductor wafer by having said wafer abut against said registration surface and by allowing said wafer to rotate into a proper registration position.

10. The apparatus as defined in claim 1, wherein said movable means for providing a a registration to a second point along a circumference of said semiconductor wafer comprises a roller, wherein said roller is fixedly mounted to a bracket that is movable approximately along the radius of said semiconductor wafer such that an approximate radial force may be applied against said wafer, and wherein said roller movably accommodates said second point along the circumference of said semiconductor wafer by having said wafer about against said roller as a result of said applied force and by allowing said wafer to rotate into a proper registration position.

11. The apparatus as defined in claim 10, further comprising two guides, wherein said two guides restrict said bracket to said approximate radial movement.

12. The apparatus as defined in claim 11, wherein said bracket and said guides are made of aluminum so as to withstand depreciative effects associated with said plurality of process instruments.

13. The apparatus as defined in claim 10, further comprising a pivot pin, wherein said pivot pin restricts said bracket to said approximate radial movement.

14. The apparatus as defined in claim 13, wherein said bracket and said pivot pin are made of aluminum so as to withstand depreciative effects associated with said plurality of process instruments.

15. The apparatus as defined in claim 1, wherein said means for providing a movable registration to a second point along the circumference of said semiconductor wafer comprises a registration surface and a third flexure, wherein said registration surface is coupled to said third flexure, wherein said third flexure is formed as a part of said support means, wherein said third flexure flexes along a radius of said semiconductor wafer such that a radial force may be applied against said wafer, and wherein said registration surface and said third flexure movably accommodate said second point along the circumference of said semiconductor wafer by having said wafer abut against said registration surface as a result of said applied force and by allowing said wafer to rotate into a proper registration position.

16. A method for providing consistent, non-jamming registration of semiconductor wafers undergoing process work in a plurality of process instruments, wherein each semiconductor wafer has a flat formed along a portion of its circumference, said method comprising the steps of:

providing a support upon which a semiconductor wafer is registered;

providing a movable registration member that movably accommodates a flat of said semiconductor wafer;

providing a movable registration member that movably accommodates a first point along the circumference of said semiconductor wafer;

providing a movable registration member that movably accommodates a second point along the circumference of said semiconductor wafer; and applying a radial force to said semiconductor wafer at said second point along the circumference of said semiconductor wafer, such that said wafer is allowed to rotate into a proper registration position, such that friction between said movable members and said wafer is minimized to reduce jamming during registration.

17. The method as defined in claim 16, wherein said step of providing a movable registration member for a first point along the circumference of said semiconductor wafer comprises providing a registration to a point along the circumference of said semiconductor wafer at approximately −120° from said wafer flat.

* * * * *